United States Patent [19]

Wentz

[11] 4,112,316
[45] Sep. 5, 1978

[54] CHARGE COUPLED DEVICE CIRCUIT WITH INCREASED SIGNAL BANDWIDTH

[75] Inventor: John L. Wentz, Ellicott City, Md.

[73] Assignee: Westinghouse Electric Corp., Pittsburgh, Pa.

[21] Appl. No.: 792,089

[22] Filed: Apr. 28, 1977

[51] Int. Cl.² .................... H01L 29/78; G11C 19/00; H03K 3/42
[52] U.S. Cl. .............. 307/304; 307/221 D; 307/311; 357/24
[58] Field of Search ................. 307/221 D, 304, 311; 357/24

[56] References Cited

U.S. PATENT DOCUMENTS

| 3,944,849 | 3/1976 | Tasch, Jr. et al. | 307/221 D |
| 3,983,408 | 9/1976 | Adam et al. | 307/221 D |
| 3,983,409 | 9/1976 | Adam | 307/221 D |

OTHER PUBLICATIONS

Hughes Aircraft Co. Technical Progress Report, dated 9/1974, entitled: "CCD Processor for Serial Scan Infrared Detector Array", Section 5, p. 55.

Primary Examiner—Larry N. Anagnos
Attorney, Agent, or Firm—H. W. Patterson

[57] ABSTRACT

A charge coupled device (CCD) circuit suitable for low level input signals, e.g., from a photodiode, is disclosed. A low noise bias current source directly injects a current into a metal-oxide-semiconductor (MOS) device in order to increase the transconductance of the CCD, consequently extending the bandwidth of the CCD without increasing output noise levels.

6 Claims, 5 Drawing Figures

CHARGE COUPLED DEVICE CIRCUIT WITH INCREASED SIGNAL BANDWIDTH

BACKGROUND OF THE INVENTION

1. Field of the Invention

The present invention relates to charge-coupled devices; and more particularly, to a circuit and method for increasing the direct injection bandwidth of a CCD.

2. Description of the Prior Art

In the conventional CCD device having an input section consisting of an input diffusion diode and adjacent electrodes, one method of injecting a signal from a signal source into a CCD is to apply the signal to the input diffusion diode. This is the direct current injection method. When the direct injection method is used, the input section of the CCD can be analyzed as though it were a common gate MOSFET (Metal-Oxide-Semiconductor-Field-Effect-Transistor), that is, the input section of a CCD consisting of an input diffusion diode, input electrode and subsequent electrodes which make up the first stage of the CCD function similarly to the source, gate, and drain of an MOSFET. The bandwidth of a signal injected into the CCD by the direct injection method is called the direct injection bandwidth.

When the direct injection mode of operation is used, the direct injection bandwidth of the CCD is proportional to the level of direct current provided by the signal source. Where the signal source is a photodiode, for example, the level of current provided by the photodiode is a function of the photon flux level of the radiation impinging upon the photodiode. At the low flux levels and contrast ratios in the useful IR bands, it is difficult to achieve sufficient signal bandwidth for applications requiring high signal bandwidth such as for TV data rate display in forward-looking-infrared (FLIR) systems, for example. In the past, a boost amplifier was used at the output of the CCD in order to compensate for the low bandwidth produced by low flux levels. But, the use of boost amplifiers in this manner increases the noise levels at the CCD output consequently degrading the performance of the device.

It is desired that a simple method and circuit be provided to increase the direct injection bandwidth of a CCD without thereby increasing noise levels and degrading device performance.

SUMMARY OF THE INVENTION

Briefly described, the invention is an MOS circuit comprising a low-noise bias current source coupled to an input electrode of metal-oxide-semiconductor (MOS) device in order to increase the transconductance of the MOS device and thereby increase the bandwidth. In one embodiment, the low-noise bias current source is directly connected to the input electrode of a charge coupled device (CCD), which electrode is commonly referred to as the input diffusion diode. In another embodiment, the low-noise bias current source is connected to the source of a metal-oxide-semiconductor-field-effect transistor (MOSFET). The increase in transconductance of an MOS in relation to the internal transconductance of the signal source increases the bandwidth of the device.

BRIEF DESCRIPTION OF THE DRAWINGS

The principles of the invention together with additional objects and features thereof will be fully understood from the following detailed description and accompanying drawings of an illustrative embodiment. In the drawing.

DETAILED DESCRIPTION OF THE INVENTION

Figure 1:
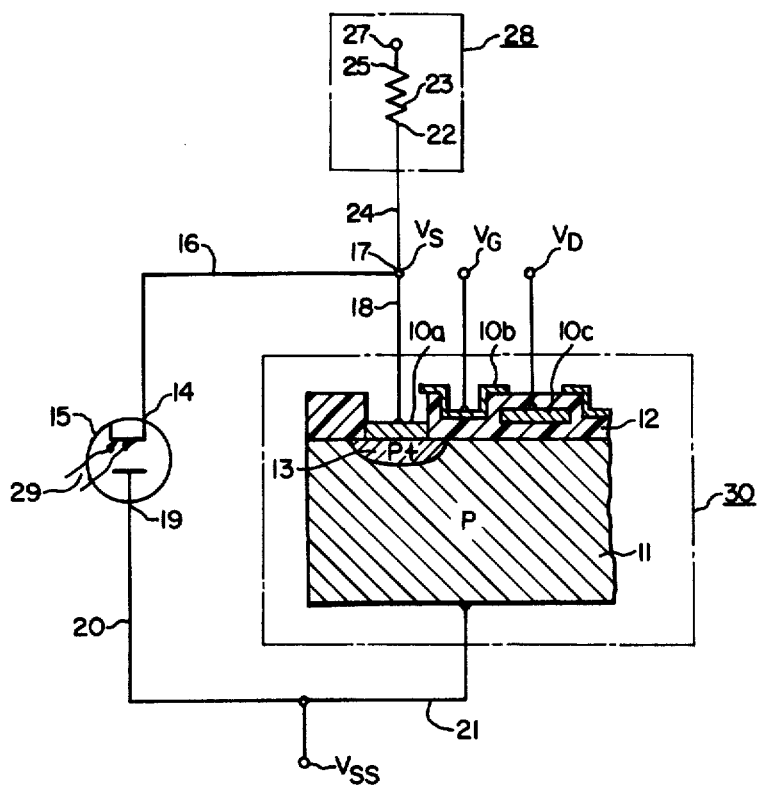
FIG. 1 is a schematic drawing of a CCD input circuit according to one embodiment of the invention.

FIG. 1 illustrates an input section of an IR detector circuit in the direct injection mode according to one embodiment of the invention. Adjacent electrodes 10b and 10c of the charge coupled device (CCD) shown within the dashed lines at 30 are insulated from a semiconductor substrate 11 and from each other by an insulation layer 12. Line portion 21 connects the substrate 11 to a voltage source $V_{SS}$ of 14V, for example. An input diffusion region 13 is formed in said substrate 11, under an input electrode 10a which makes ohmic contact with said substrate 11. The nodes 10a, 10b, and 10c are at bias voltage potentials $V_S$, $V_G$, and $V_D$, respectively, where for a typical p-channel CCD $$5V \leq |V_D - V_G| \leq 10V \qquad (1)$$
$$1V \leq |V_G - V_S| \leq 4V$$

A cathode terminal 14 of a photodiode 15 is connected by a line 16 through a node 17 and a line portion 18 to the input electrode 10a. An anode terminal 19 of the photodiode 15 is connected by line portion 20 to the voltage source $V_{SS}$. A current source shown within the dashed lines at 28 includes a first terminal 22 of a resistor 23 is connected by a line portion 24 through node 17 and line portion 18 to the input electrode 10a. Resistor 23 can be any resistor of suitable CCD application, such as a thin film resistor. A second terminal 25 of resistor 23 is connected by line portion 26 to a voltage source 27.

Figure 2:
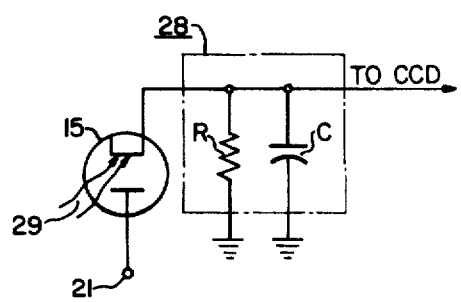
FIG. 2 is a schematic representation of the internal impedance of a photodiode.

In operation of the circuit shown in FIG. 1, the photodiode 15 injects a current corresponding to IR irradiation 29 of a scanned target into the diffusion region 13. Part of the current provided by the diode 15, however, is shunted by the internal impedance of the diode 15 shown in FIG. 2 within the dashed lines at 28. The total current, $I_1$, injected into the CCD at the input electrode 10a, then, is $$I_1 = I_d \left( \frac{Z_D}{Z_D + Z_I} \right) \qquad (2)$$

where:

$I_d$ = the total current provided by the diode 15;

$Z_D$ = the internal impedance of the diode 15;

$Z_I$ = the impedance of the diffusion region 13. The impedance of the diffusion region 13, $Z_I$, can also be expressed in terms of the transconductance, $g_m$, of the region 13, where:

$$Z_I = 1/g_m \quad (3)$$

Substituting equation (2) into equation (1), the total injected current, $I_T$, can be expressed as a function of the transconductance, $g_m$:

$$I_1 = I_d\left(\frac{Z_D}{Z_D + 1/g_m}\right) \quad (4)$$

It is observed that as $g_m$ gets very large, the ratio in equation (3) approaches unity and the injected current, $I_1$, approaches a maximum, i.e., the injected current from the diode 15, $I_1$, is directly proportional to the transconductance $g_m$.

A similar analysis, using a MOSFET analogy, shows that the injection bandwidth, $f_o$, of a CCD in the direct injection mode is also directly proportional to the input transconductance, $g_m$. The relation can be expressed as:

$$f_o = \frac{g_m R + 1}{2CR\pi} \text{ Hz} \quad (5)$$

where:
R = the detector 15 resistance in FIG. 2
C = total input capacitance at 17
$g_m$ = transconductance of the MOSFET equivalent of the CCD.

For $R >> 1/g_m$ as is the requirement for a practical detector we have:

$$f_o = \frac{g_m}{2\pi C} \text{ Hz} \quad (6)$$

Also, the input transconductance of the input diffusion region is directly proportional to the magnitude of the total current injected into the region. The relationship can be expressed as:

$$g_m = 2\theta \frac{kT}{q}\left[\left(1 + 2I_{DC}\frac{(q/kT)^2}{2\theta}\right)^{\frac{1}{2}} - 1\right] \text{MHO} \quad (7)$$

where:
k = Boltzmann's constant
T = absolute temperature
q = electron charge
$\theta$ = M $C_{ox}$ W/L
$I_T$ = total injected current
where:
M = minority carrier surface mobility
$C_{ox}$ = oxide capacitance per unit area
W = gate width
L = gate length.

Substituting equation (7) into equation (6) results in an expression of the bandwidth, $f_o$, as a function of the transconductance, $g_m$:

$$f_o = \frac{2\theta \frac{kT}{q}\left[\left(1 + 2I_T\frac{q/KT)^2}{2\theta}\right)^{\frac{1}{2}} - 1\right]}{2\pi RC} \quad (8)$$

From equation (8) it is observed that the bandwidth of a CCD is proportional to the total current injected into the CCD, $I_T$. The current, $I_b$, from the diode 15 cannot provide additional current to increase the bandwidth because, from equation (4), $I_1$ is a function of $g_m$ which in turn, from equation (7), is a function of $I_T$. In the present invention, additional bias current is injected into the diffusion region 13 by the current source 28.

In addition to the signal bandwidth increase realized by injecting a direct current bias from a low-noise current source into the CCD along with the signal current, the invention provides a means to obtain detector/CCD polarity compatibility and immunity from CCD charge saturation at large signal levels. The maximum current, $I_{max}$, that can be injected into a CCD without charge saturation is determined approximately by the relation:

$$I_{max} = \frac{e \cdot (Ne)}{T_c} \text{ amps} \quad (9)$$

where:
$e = 1.60203 \times 10^{-19}$ coulomb (the charge of a single electron)
$Ne \simeq 10^8$ (approximate number of electrons injected into the CCD)
$T_c$ = clock period in seconds (the frequency with which successive packets are moved through the CCD)

Figure 3:
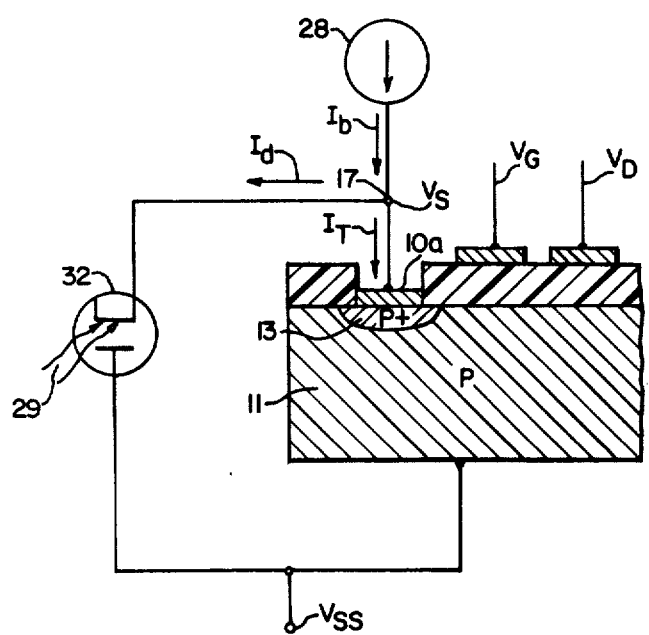
FIG. 3 is a schematic drawing showing current flows in a p-channel CCD input circuit with a common anode-photovoltaic (CAPV) diode.

Referring to FIG. 3, where like reference characters to those in FIG. 1 are used for clarity of explanation when a common anode photovoltaic (CAPV) detector 32 and bias current source 28 is connected for direct injection into a p-channel CCD, the CAPV detector produces a direct current flow in the direction of $I_d$ when illuminated by a level of photon flux represented by the arrows at 29. The total or net current, $I_T$, injected into the CCD is determined by the equation:

$$I_T = I_b - I_d \quad (10)$$

where $I_b$ is the current injected into the electrode 10a by the current source 28. Since a p-channel CCD requires positive current flow into the input electrode 10a, to obtain proper input biasing for direct injection, the condition $|I_b| > |I_d|$ must exist. A benefit of the invention is that it provides a method of operating a CCD detector circuit using a CAPV detector. Without the addition of the current $I_b$ provided by the current source 28, a p-channel CCD detector circuit using a CAPV detector would be difficult to bias properly since $I_b$ would be zero an the condition $|I_b| > |I_d|$ would not exist. In addition, the operation of the circuit of the invention using a CAPV detector and a p-channel CCD provides an automatic current limiting feature in that at large levels of photon flux 27, $I_T$ decreases away from $I_{max}$ as given in equation (9). Satisfactory operation of the circuit is obtained by choosing $I_b$ such that at the largest expected $I_d$, $I_T$ in equation (9) is just large enough to achieve the lowest desired bandwidth as computed in equation (8).

Figure 4:
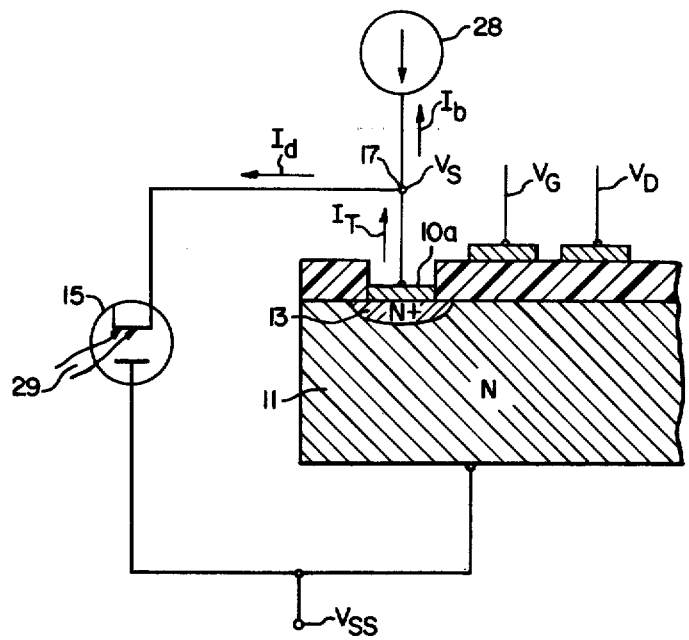
FIG. 4 is a schematic drawing showing current flows in an n-channel CCD input circuit with a common-anode-photovoltaic diode.

FIG. 4 illustrates current flows for an n-channel CCD input circuit with the CAPV diode 32 as the signal source. There is no concern in this configuration with proper biasing because the direction of the current, $I_d$, is proper for proper biasing of an n-channel CCD, i.e., $I_d$ is in the direction away from the input electrode 10a. The current, $I_b$, in this case should be chosen such that, at the largest expected $I_d$, $I_T$ is lower than $I_{max}$ as computed in equation (9). For the n-channel device, the proper bias voltages are of similar magnitude but of opposite polarity from the bias voltages for the p-channel device in FIG. 1.

Figure 5:
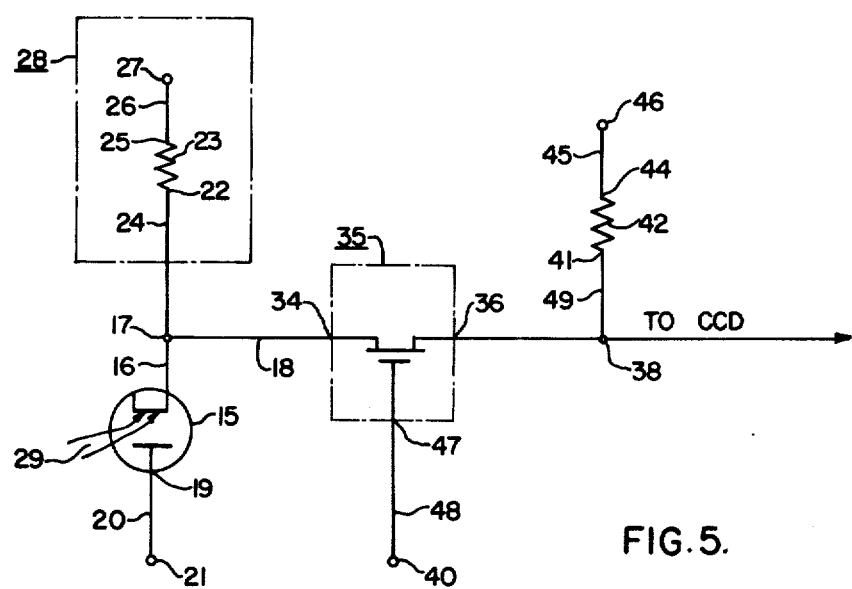
FIG. 5 is a schematic drawing of a CCD input circuit according to a second embodiment of the invention.

FIG. 5 illustrates an input section of an IR detector circuit in the voltage input mode according to a second embodiment of the invention. The cathode 14 of the photodiode 15 is connected through the line portion 16, the node 17, and the line portion 18 to a source terminal 34 of a p-channel MOSFET represented within the dashed lines at 35. The anode 19 of the photodiode 15 is connected by the line portion 20 to the voltage source 21. The first terminal 22 of the resistor 23 is connected through the line portion 24, the node 17, and the line portion 18 to a source terminal 34 of the MOSFET 35. The second terminal 25 of the resistor 23 is connected through the line portion 26 to the voltage source 27. A gate terminal 47 of the MOSFET 35 is connected by a line portion 48 to a voltage source 40. A drain terminal 36 of the MOSFET 35 is connected by a line portion 37 through a node 38 and a line portion 39 to the electrode 10a of FIG. 4. A first terminal 41 of a load resistor 42 is connected through a line portion 49, the node 38, and the line portion 39 to electrode 10a. A second terminal 44 of the resistor 42 is connected by a line portion 45 to a voltage source 46.

For proper biasing, the nodes 17 and 38, and the voltage source 40 are at voltage potentials $V_S$, $V_D$, $V_G$, respectively, as defined in equation (1). The voltage source 21 is at ground potential (OV).

In operation of the circuit shown in FIG. 5, the photodiode 15 injects a current corresponding to IR irradiation 29 of a scanned target into the terminal region 34 of the MOSFET 35. An analysis similar to that done with the diffusion region 13 in the circuit in FIG. 1 applies to the source terminal 34 of the MOSFET 35. The additional current injected into the terminal 34 by the resistor 23 increases the bandwidth, $f_\alpha$ of the MOSFET 35 according to the equation (8). The load resistor 42 converts the MOSFET output signal to a voltage suitable to operate the input section of a CCD in the voltage input mode.

It is to be appreciated that this circuit increases bandwidth without increasing CCD noise in the input channel. Analysis has shown that, with a boost amplifier connected to the output of the amplifier, the rms channel thermal and $1/f$ noise is given by:

$$\bar{v}_c^2 = \left(\frac{\beta v_\infty}{4Cf_o}\right)^2 \left[\frac{1}{2R^2}\ln\frac{f_o^2}{2f_1^2} + \frac{1}{2}\left(\frac{g_m f_o}{f_g}\right)^2 \ln 2\right] +$$

$$\frac{8kT}{3g_m f_o}\left(\frac{\beta}{4C_o}\right)^2 \left[\frac{\pi}{4R^2} + \left(\frac{g_m f_o}{f_g}\right)^2 (1-\frac{\pi}{4})\right] \text{volt}^2 \quad (11)$$

where:

$\beta$ = CCD sample duty cycle
$C_o$ = CCD output capacitance
$g_m$ = CCD input transconductance
$f_g = g_m/2\pi C$ = direct injection bandwidth (Hz)
$f_o$ = desired signal bandwidth
$f_1$ = lower cutoff frequency of signal bandwidth ($f_1 < f_o$)
$v_\infty$ = spectral density of channel $1/f$ noise at 1 Hz − volt/Hz$^{\frac{1}{2}}$ The analysis is made for an FLIR system which employs serial scan with sufficient number of detectors to realize an output signal-to-noise ratio which increases directly as the square root of the number of detectors. Under these conditions, the noise sources which must be considered are the photon shot noise, detector thermal noise, and the rms channel thermal and $1/f$ noise. Only the rms channel thermal and $1/f$ noise is given in Equation (11) because only that noise affects system performance by the configuration of the instant invention. Also, in Equation (11), signal aliasing in the CCD output is effectively eliminated where the CCD clock frequency, $f_c$, is related to $f_o$ by the equation $f_c = 4f_o$.

For $R >> 1/g_m$ in Equation (11), the expression for $\bar{v}_c^2$ can be simplified to:

$$\bar{v}_c^2 = \left(\frac{\beta v_\infty \pi C}{8C_o}\right)^2 \ln 2 + \frac{8kT}{6\pi C}\left(\frac{\pi\beta C}{2C_o}\right)^2 (1-\frac{\pi}{4})\frac{f_o}{f_g} \quad (12)$$

The first term in Equation (12) is the $1/f$ contribution and the second term is the thermal contribution. Examination of the expression shows that, for all practical situations, a minimum is achieved when $f_o = f_g$. This invention provides a means for achieving this condition.

It is to be understood that the insulation separating the electrodes from each other is not necessarily the same as the insulation separating the electrodes from the semiconductor substrate.

What I claim is:

1. A metal-oxide-semiconductor device circuit comprising:

a semiconductor device including a semiconductor substrate and an input electrode making ohmic contact with a surface of said substrate and forming an ohmic junction therewith, said junction being characterized by an input impedance, $1/g_m$, wherein $g_m$ is the transconductance of said junction, an output electrode adjacent said input electrode overlying and electrically connected to said surface of said substrate, a gate electrode between said input and output electrodes overlying and insulated from said surface of said substrate;

means for generating an electrical signal;

means for connecting said electrical signal to said input electrode; and current source means for applying an additional current to said input electrode to reduce the input impedance of said ohmic junction.

2. A circuit according to claim 1, wherein said output electrode is insulated from said substrate.

3. A circuit according to claim 1, wherein said output electrode makes ohmic contact with said substrate.

4. A circuit according to claim 1, wherein said means for generating an electrical signal includes means for producing an electrical signal in response to light or radiation.

5. A circit according to claim 1 wherein said current source means includes a thin film resistor having a first terminal and a second terminal, means for applying a voltage to said first terminal, said second terminal being connected to said input electrode.

6. A method for increasing the bandwidth of a signal injected into a metal-oxide-semiconductor (MOS) device having an input diffusion region comprising the steps of: generating a bias current, and injecting said bias current into said input diffusion region of said MOS device.

* * * * *